Oct. 20, 1970 G. R. HOFFMAN 3,535,656

VOLTAGE CONTROLLED SOLID STATE CIRCUIT

Filed Sept. 27, 1968 2 Sheets-Sheet 1

GARY R. HOFFMAN
INVENTOR

BY [signature]

ATTORNEY

Oct. 20, 1970 G. R. HOFFMAN 3,535,656

VOLTAGE CONTROLLED SOLID STATE CIRCUIT

Filed Sept. 27, 1968 2 Sheets-Sheet 2

GARY R. HOFFMAN
INVENTOR

BY [signature]

ATTORNEY

United States Patent Office
3,535,656
Patented Oct. 20, 1970

3,535,656
VOLTAGE CONTROLLED SOLID STATE CIRCUIT
Gary R. Hoffman, Glenarm, Md., assignor to The Bendix Corporation, a corporation of Delaware
Filed Sept. 27, 1968, Ser. No. 763,186
Int. Cl. H03c *3/16*
U.S. Cl. 331—117 10 Claims

ABSTRACT OF THE DISCLOSURE

This invention describes a voltage controlled solid state circuit which is useful as either a voltage controlled oscillator or a voltage controlled sweep generator. When operating as a voltage controlled oscillator a D.C. input voltage or load resistance is supplied to the input terminals of the circuit. The frequency variation of the output is inversely proportional to the D.C. voltage level variation of the input, as the base current $I_b$ increases the frequency will decrease. In this usage the circuit is useful in phase lock loops, wide and narrow deviation FM sources, and other similar usages. The circuit is useful as a sweep generator when an A.C. modulation voltage is applied to the input terminals. In this usage the output frequency deviation varies in accordance with the amplitude of the A.C. input. The circuit is composed of a transistor having the usual biasing elements. A resonant circuit including an inductor is connected across the base collector junction of the transistor. The collector to base junction parameters are utilized in a resonant loop to establish the frequency of oscillation.

Conventional voltage controlled oscillators ordinarily employ a tuning circuit and a capacitive voltage dividing network to provide the feedback necessary for sustaining oscillations. Such arrangements operate satisfactorily for some adaptations. However, a major deficiency of such circuits stems from the use of the capacitive dividing network. Because the capacitors in these networks cannot be reduced below a minimum value, the bandwidth, or tuning range, of the oscillator is limited. This limitation can be partially overcome by the use of varactors in the voltage dividing network. The primary disadvantage of these circuits is the expense of the varactors and the inability to reduce their physical size. The circuits are consequently not appropriate for use in miniaturized and integrated circuit systems. Furthermore, even although varactors permit a somewhat broader bandwidth of operation the bandwidth is still limited. This has led to the use of a set of Y connected varactors connected across the collector-emitter junction of a transistor. The third leg of the Y is connected to ground and the control voltage is injected at the common point of the Y. Such a connection operates with a bandwidth of approximately one octave but obviously is quite expensive and cannot be readily miniaturized. Such a network may also require a second, higher voltage, power supply in order to obtain a maximum capacitance change from the varactor junction. Such varactors commonly produce perimetric oscillations thus generating undesirable spurious energy. Several forms of sweep generators are also presently available. These circuits also have the disadvantage of employing external tuning elements in order to vary the output frequency. Quite frequently the external tuning elements are varactors and therefore the sweep generators suffer essentially the same disadvantages as the voltage controlled oscillators which also employ varactors. Another deficiency of the presently available sweep generators is the complexity of the systems, which obviously substantially increases the cost of the equipment.

It is therefore an object of this invention to provide a voltage controlled oscillator having no external tuning elements.

It is another object to provide such a voltage controlled oscillator which has a bandwidth exceeding a decade.

It is another object to provide such a voltage controlled oscillator which operates at any frequency selected at the time the circuit is fabricated.

It is another object to provide a voltage controlled oscillator which operates as a sweep generator when an A.C. modulation control voltage is applied to the input thereof.

It is another object to provide such a voltage controlled oscillator which yields a constant frequency output when a constant D.C. voltage is applied to the input terminals thereof.

It is another object to provide such a voltage controlled oscillator that uses a base collector junction for selectivity and emitter junction for load isolation.

Further objects, features and advantages of the invention will become apparent from the following description and claims when read in view of the accompanying drawings, wherein like numbers indicate like parts and in which:

Figure 1:
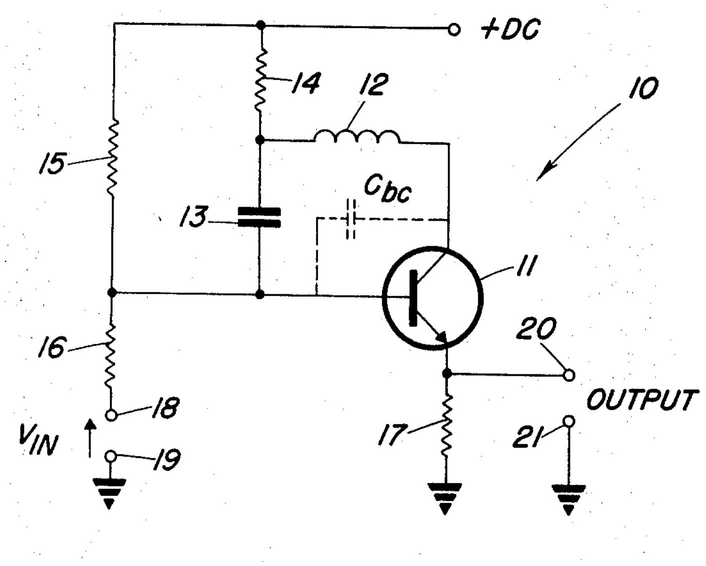
FIG. 1 shows a first preferred embodiment of the inventive circuit.

In FIG. 1 the inventive oscillator is designated generaly by reference numeral 10. The circuit is composed of a transistor 11 having an inductor 12 and a capacitor 13 serially connected across the base to collector junction thereof. A biasing resistor 14 is connected to the junction of inductor 12 and capacitor 13. A second biasing resistor 15 is connected to the base of transistor 11. Both these resistors have their other ends connected to a positive D.C. biasing source. A pair of output terminals 20 and 21 are connected to resistor 17 which is connected into the emitter circuit of transistor 11. An input voltage generally indicated as $V_{in}$ can be either a D.C. voltage or an A.C. voltage. If a D.C. voltage is used the output present at terminals 20 and 21 will be a continuous wave the frequency of which is proportional to the voltage level of the input. In this instance the circuit operates as a voltage controlled oscillator and can be used in phase locked loops and other such usages. If the input voltage $V_{in}$ is an A.C. voltage the circuit serves as a sweep generator in that the frequency of the output varies directly proportionally to the amplitude of the input signal. It should be noted that the output can be taken by coupling the primary of a transformer across terminals 20 and 21 and taking the R.F. output off the secondary of the transformer. This is a matter of design choice and forms no part of the invention.

Figure 4:
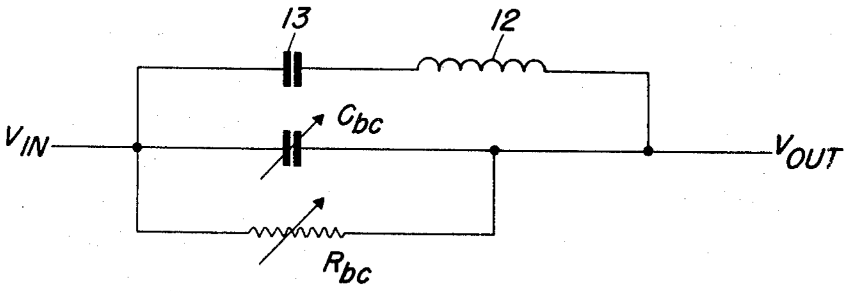
FIG. 4 shows a simplified equivalent circuit of the resonant circuit of the inventive oscillator.

The operation of the circuit can be best understood by referring to the simplified equivalent circuit shown in FIG. 4. In this figure the inductor 12 and capacitor 13 are shown serially connected with the series combination being in parallel with the base to collector junction capacitance $C_{bc}$ of transistor 11. The base-collector junction resistance $R_{bc}$ is in parallel with the junction capacitance. The value of capacitor 13 is large so that its capactive reactance at the center of the desired operating frequency band is negligible as compared to the inductive reactance of inductor 12. The primary function of capacitor 13 is therefore simply to keep the bias voltage from the base of transistor 11. The value of inductor 12 is chosen such that the equivalent circuit of FIG. 4 is resonant at the center frequency of the desired frequency range. Because capacitor 13 has no substantial effect on the resonant frequency the resonant frequency is determined by the value of inductor 12 and the base-collector junction capacitance $C_{bc}$ of transistor 11. The frequency of the output is varied because the values of $C_{bc}$ and $R_{bc}$ change as the voltage level of the input changes. $R_{bc}$ and $C_{bc}$ are shown as adjustable because they vary as the input voltage $V_{in}$ varies.

FIG. 4 clearly shows that the base to collector junction capacitance and resistance are combined with inductors 12 to form a resonant loop which establishes the frequency of oscillation of the output. The frequency of the resonant loop is controlled by both the capacitive characteristic $C_{bc}$ and the resistive characteristic $R_{bc}$. As the current through transistor 11 is increased the frequency of oscillation becomes lower. Also, as the collector to base voltage increases the frequency of oscillation increases. This inverse condition produces a cancelling effect on power supply voltage changes. However, when the base voltage is increased the current in the oscillator transistor 11 is increased causing a frequency decrease. At the same time, the collector to base voltages also decreases causing the capacitance $C_{bc}$ to increase. The increases of $C_{bc}$ also results in a frequency decrease. Increases in the current through transistor 11 result in an increase of capacitance $C_{bc}$ because of the larger signal which then appears across the collector to base junction. This is expected because, as stated above, current increases cause the frequency of oscillation to decrease. The larger collector to base signal is produced by an increase of the gain of transistor 11, which occurs with the increase of current through transistor 11.

These various effects result in a very stable and useful circuit. When power supply voltage changes occur the effects of the voltage change across the collector to base junction, and the resultant change in the junction capacitance offset one another and provide frequency stability. However, when the base voltage changes the effects of the voltage and capacitance changes across the junction act in the same direction and enhance the frequency change in the output signal. Consequently, a small voltage change on the base causes a large change in the output frequency.

The circuit operates in a manner which utilizes characteristics which are normally considered undesirable in semiconductive devices.

In order to sustain oscillations the collector to emitter voltage of transistor 11 must equal or exceed the base to emitter voltage, and the collector to emitter voltage must be 180° out of phase with the base to emitter voltage. The first of these requirements is fulfilled by the use of inductor 12. The second requirement is fulfilled by the inherent operation of transistor 11.

The circuit as shown has several distinct advantages. The first advantage is the simplicity of the circuit in that it requires no external frequency adjusting components. Another advantage is the nearly instantaneous frequency selection over either a wideband or narrow band of frequency, depending entirely upon the variation of the input voltage. Another advantage stems from the fact that the frequency control voltage can be very small in amplitude. As an example, a voltage at the base of approximately 7 volts variation will cause a wideband frequency output in excess of a decade. Another distinct advantage of the circuit is the isolation of the output terminals from the frequency controlling base-collector junction.

Figure 2:
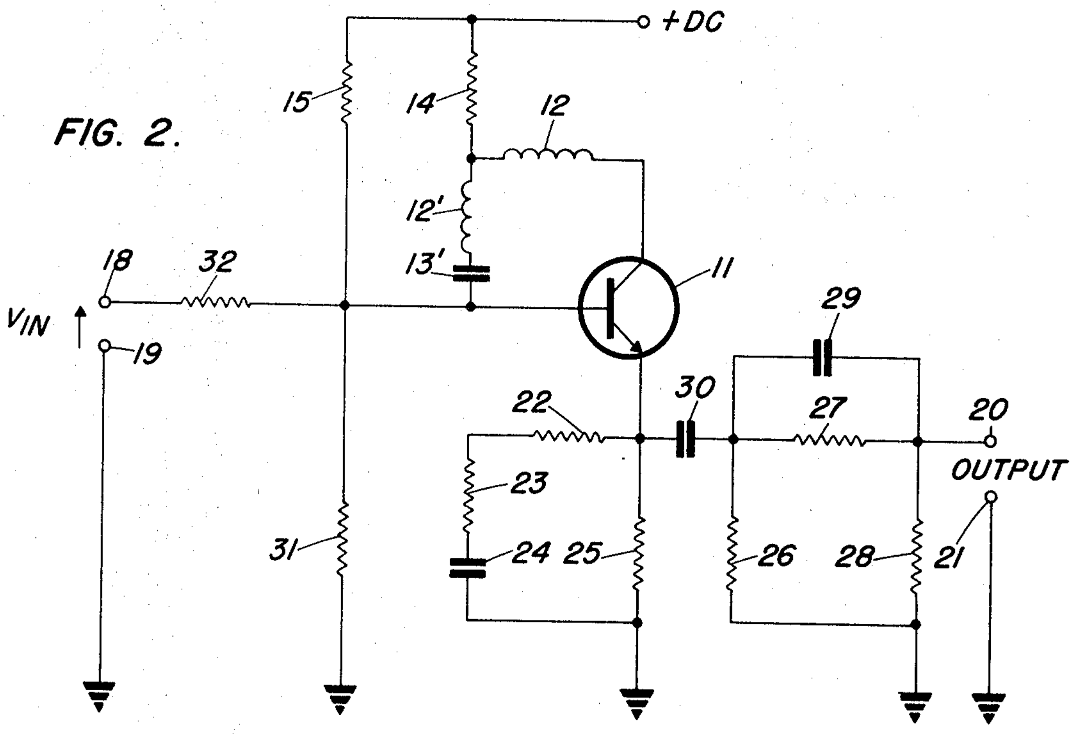
FIG. 2 shows a second preferred embodiment which is very similar to the FIG. 1 embodiment, but which includes a frequency sensitive pad to control the flatness and stability of the output signal.

In FIG. 2 a second preferred embodiment is indicated generally by reference numeral 10'. Although the major differences between this embodiment and that in FIG. 1 occur in the output circuitry it should be noted that the resonant circuit connected across the base-collector junction inludes a second inductor designated as 12'. Inductor 12' represents the inductance of the terminals of capacitor 13. This is done to more clearly indicate that at an intended operating frequency of several hundred megacycles the inductance of the capacitor leads is a factor which should be considered in the selection of the inductive value of the resonant circuit. The output network is seen to be composed of two frequency sensitive networks. The first network is composed of a serial connection of resistor 22, inductor 23, and capacitor 24 with the series combination being connected in parallel with a resistor 25. The second frequency sensitive network includes a resistive voltage dividing network composed of resistors 26, 27 and 28 with a capacitor 29 shunted across resistor 27. The output voltage is taken from the junction of resistor 27 and capacitor 29. As the output frequency of transistor 11 either increases or decreases the impedance of the two networks likewise increases or decreases, because of the reactance changes in inductor 23 and capacitors 24 and 29, and therefore the flatness of the output bandwidth is increased by the use of the two frequency sensitive networks.

Figure 3:
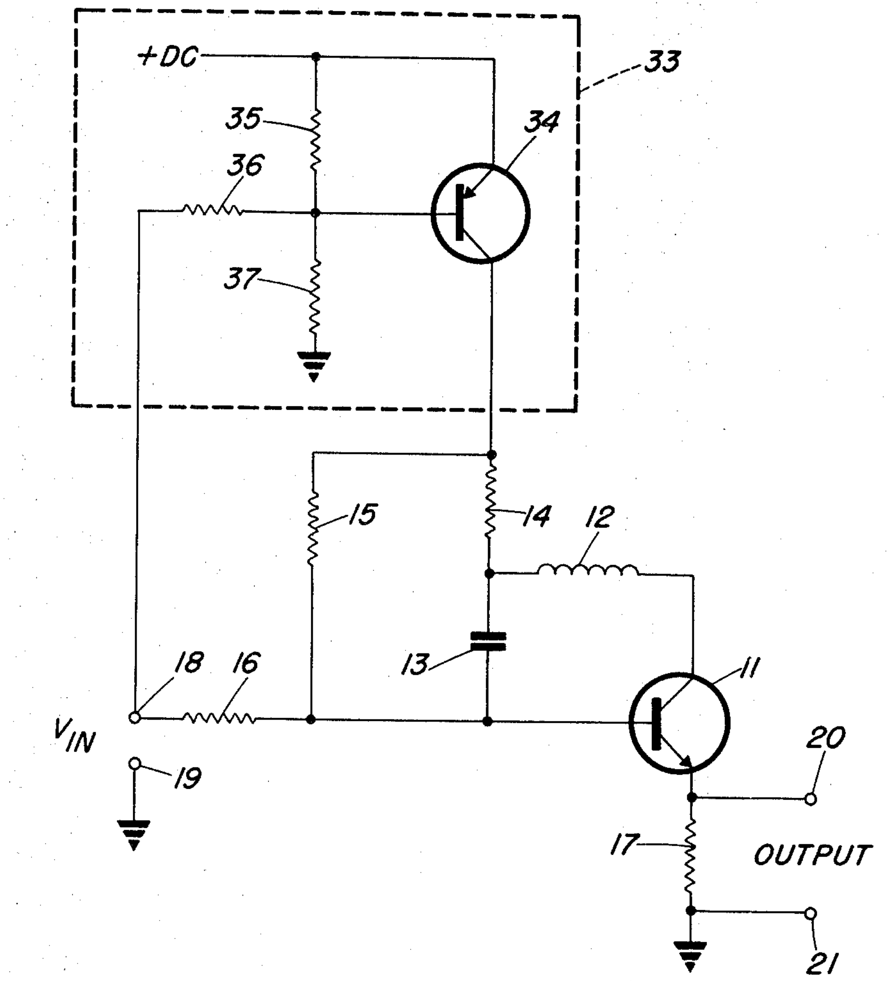
FIG. 3 is very similar to FIG. 1 but includes a power supply varying circuit to improve the flatness of the output signal.

FIG. 3 shows an embodiment which is very similar to the embodiment of FIG. 1 with the primary modification being the application of the biasing potential through the power supply varying circuit generally indicated by reference numeral 33. The power supply varying circuit 33 is composed of a transistor 34 the emitter of which is connected to a positive D.C. source. The biasing network composed of resistors 35, 36 and 37 is connected to the base of transistor 34 to insure that a constant voltage is applied to the biasing network of the oscillating circuit.

It should be noted that although the circuit 33 is shown used in conjunction with the embodiment of FIG. 1 this is a matter of convenience in illustration only as a similar circuit could obviously be used in conjunction with the embodiment of FIG. 2 as well. The primary advantage of the power supply circuit 33 stems from the fact that the offsetting effects of the base to collector capacitance and resistance changes of transistor 11 are not exactly equal and therefore the output of the circuit will be somewhat influenced by any changes which occur in the biasing potential. The use of the power supply circuit 33 eliminates this possible error.

Although this invention has been described with respect to particular embodiments thereof, it is not to be so limited, as changes and modifications may be made therein which are within the spirit and scope of the invention as defined by the appended claims.

The invention claimed is:

1. A voltage controlled circuit comprising: a transistor having its base connected to a voltage input terminal; output circuit means receiving output signals from the emitter of said transistor; resonant circuit means between the collector and base of said transistor, said resonant circuit means including the base collector junction capacitance as a major tuning element thereof; and means for receiving a biasing voltage.

2. The voltage controlled circuit of claim 1 wherein said resonant circuit means includes an inductive reactance means and a capacitive reactance means; said inductive reactance means substantially equalling the capacitive reactance of said base collector junction at the center operating frequency of said voltage controlled circuit; and the capacitive reactance of said capacitive reactance means being negligible with respect to said inductive reactance.

3. The voltage controlled circuit of claim 2 wherein said input terminal is adapted for connection to an A.C. voltage source so that the output of said voltage controlled circuit varies in frequency as the input voltage varies in amplitude.

4. The voltage controlled circuit of claim 2 wherein said input terminal is adapted for connection to a D.C. voltage source so that the output of said voltage controlled circuit is a continuous wave, the frequency of which is a function of the level of said D.C. voltage source.

5. The voltage controlled circuit of claim 3 wherein said output circuit means includes a frequency sensitive means to stabilize and flatten the frequency response curve of said output.

6. The voltage controlled circuit of claim 2 wherein said output circuit means includes a frequency sensitive inductive-capacitive branch and a frequency sensitive resistive-capacitive branch connected in parallel.

7. The voltage controlled circuit of claim 6 wherein said inductive-capacitive branch is a series resonant circuit and said resistive-capacitive branch includes a capacitor and a resistor in parallel.

8. The voltage controlled circuit of claim 7 wherein said means for receiving a biasing voltage is connected to a power supply varying circuit.

9. The voltage controlled circuit of claim 1 wherein said means for receiving a biasing voltage is connected to a power supply varying circuit.

10. The voltage controlled circuit of claim 2 including a power supply varying circuit for supplying an input to said means for biasing, said power supply varying circuit including a second transistor and a resistive biasing network.

References Cited

UNITED STATES PATENTS 3,435,376 3/1969 Weber et al. -------- 331—117

JOHN KOMINSKI, Primary Examiner

U.S. Cl. X.R.

332—16; 334—15